(12) United States Patent
Fukunaga et al.

(10) Patent No.: US 6,519,842 B2
(45) Date of Patent: Feb. 18, 2003

(54) METHOD FOR MOUNTING SEMICONDUCTOR DEVICE

(75) Inventors: Akira Fukunaga, Tokyo (JP); Hiroshi Nagasawa, Tokyo (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 09/731,898

(22) Filed: Dec. 8, 2000

(65) Prior Publication Data
US 2001/0006455 A1 Jul. 5, 2001

(30) Foreign Application Priority Data
Dec. 10, 1999 (JP) ............................ 11-351796
Dec. 10, 1999 (JP) ............................ 11-351797

(51) Int. Cl.⁷ ................................................ H05K 3/34
(52) U.S. Cl. ............................ 29/840; 29/740; 29/832; 174/260
(58) Field of Search ................. 29/840, 832, 831, 29/26.35, 740; 174/260, 263; 361/760, 767; 438/713, 714; 428/344, 209; 228/123.1

(56) References Cited

U.S. PATENT DOCUMENTS

| 4,333,966 A | | 6/1982 | Deffeyes et al. | |
|---|---|---|---|---|
| 4,401,767 A | | 8/1983 | Dietz et al. | |
| 4,436,785 A | | 3/1984 | Dietz et al. | |
| 4,459,166 A | | 7/1984 | Dietz et al. | |
| 4,463,030 A | | 7/1984 | Deffeyes et al. | |
| 4,652,465 A | | 3/1987 | Koto et al. | |
| 4,670,188 A | * | 6/1987 | Iwasa et al. | 252/513 |
| 4,749,120 A | * | 6/1988 | Hatada | 228/123 |
| 4,855,102 A | * | 8/1989 | Okada et al. | 419/8 |
| 4,859,241 A | | 8/1989 | Grundy | |
| 5,194,128 A | * | 3/1993 | Beaty et al. | 204/164 |
| 5,196,371 A | * | 3/1993 | Kulesza et al. | 437/183 |
| 5,286,927 A | * | 2/1994 | Ueno et al. | 174/257 |
| 5,477,419 A | * | 12/1995 | Goodman et al. | 361/760 |
| 5,714,252 A | * | 2/1998 | Hogerton et al. | 428/344 |
| 5,832,595 A | * | 11/1998 | Maruyama et al. | 29/829 |
| 5,860,212 A | * | 1/1999 | Matsuhira | 29/840 |
| 5,882,722 A | | 3/1999 | Kydd | |
| 5,918,364 A | * | 7/1999 | Kulesza et al. | 29/832 |
| 5,976,393 A | * | 11/1999 | Abe | 216/18 |
| 5,981,305 A | * | 11/1999 | Hattori | 438/20 |
| 6,010,831 A | * | 1/2000 | Hatakeyama et al. | 430/323 |
| 6,068,939 A | * | 5/2000 | Maeda et al. | 428/689 |
| 6,189,208 B1 | * | 2/2001 | Estes et al. | 29/840 |
| 2001/0006455 A1 | * | 7/2001 | Fukunage et al. | 361/760 |

FOREIGN PATENT DOCUMENTS

| JP | 6484738 | * | 3/1989 | ........ 438/DIG. 343 |
|---|---|---|---|---|
| JP | 5-251453 | * | 9/1993 | |
| JP | 9-5807 | * | 1/1997 | |
| JP | 10-183207 | | 7/1998 | |
| JP | 2000-200930 | * | 7/2000 | |

OTHER PUBLICATIONS

IBM technical Disclosure Bulletin, Mar. 1996, pp. 169–170 (abstract and dwg only).*

* cited by examiner

Primary Examiner—Peter Vo
Assistant Examiner—Minh Trinh
(74) Attorney, Agent, or Firm—Browdy and Neimark, P.L.L.C.

(57) ABSTRACT

Semiconductor devices can be mounted by the bump technique using compound metallic ultra-fine particles. Each particle comprises a core portion which is substantially a metallic component, with a coating layer chemically bound to the core portion, the coating layer being an organic substance. One of two bump technologies can be used to mount the semiconductor device, namely, forming under bump metals from the compound metallic ultra-fine particles, and forming ordinary solder balls on the under bump metals; or using paste balls comprising the compound metallic ultra-fine particles rather than ordinary solder balls.

9 Claims, 7 Drawing Sheets

F I G. 1A
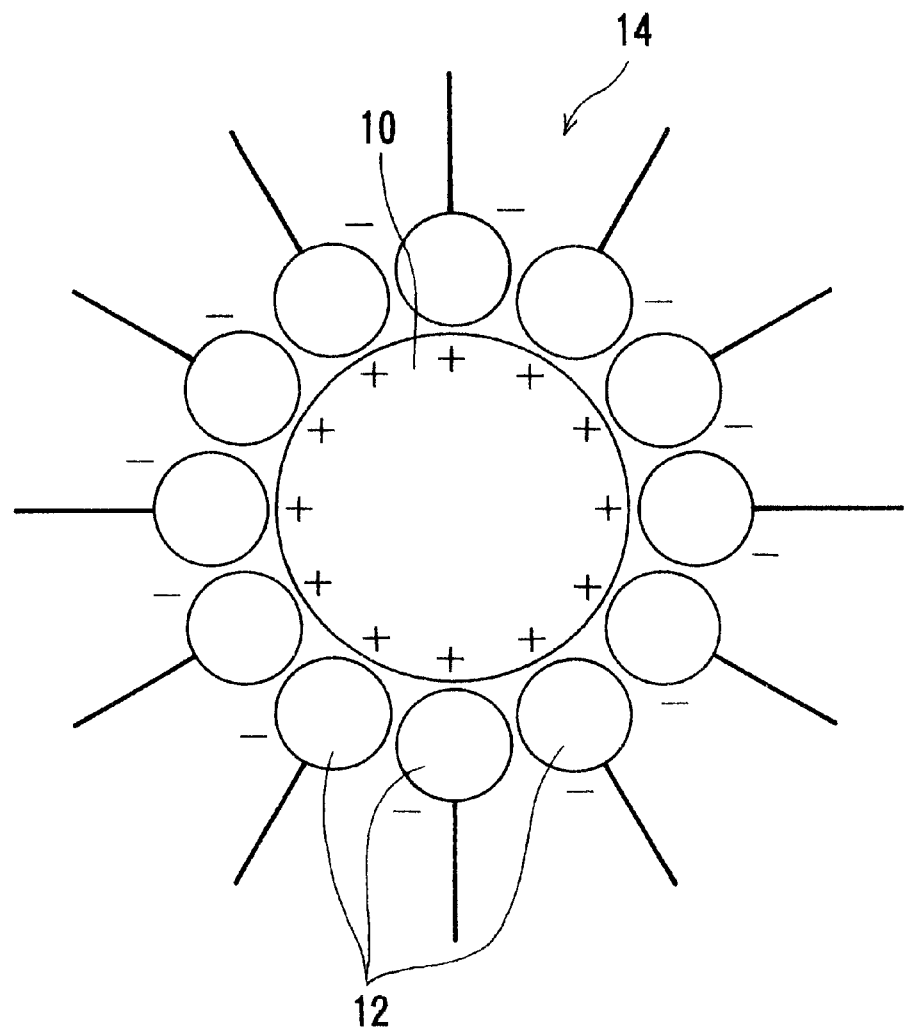
F I G. 1B
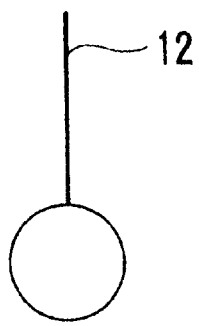

F I G. 6
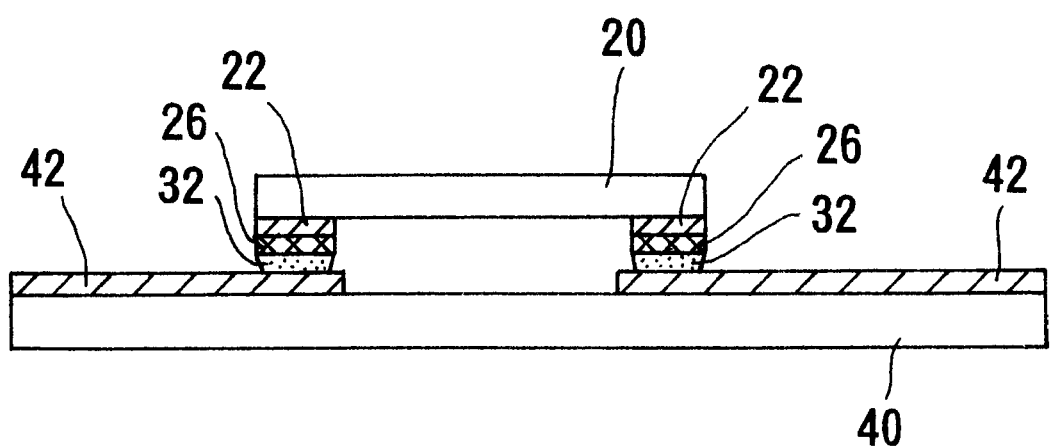

F I G. 1 0
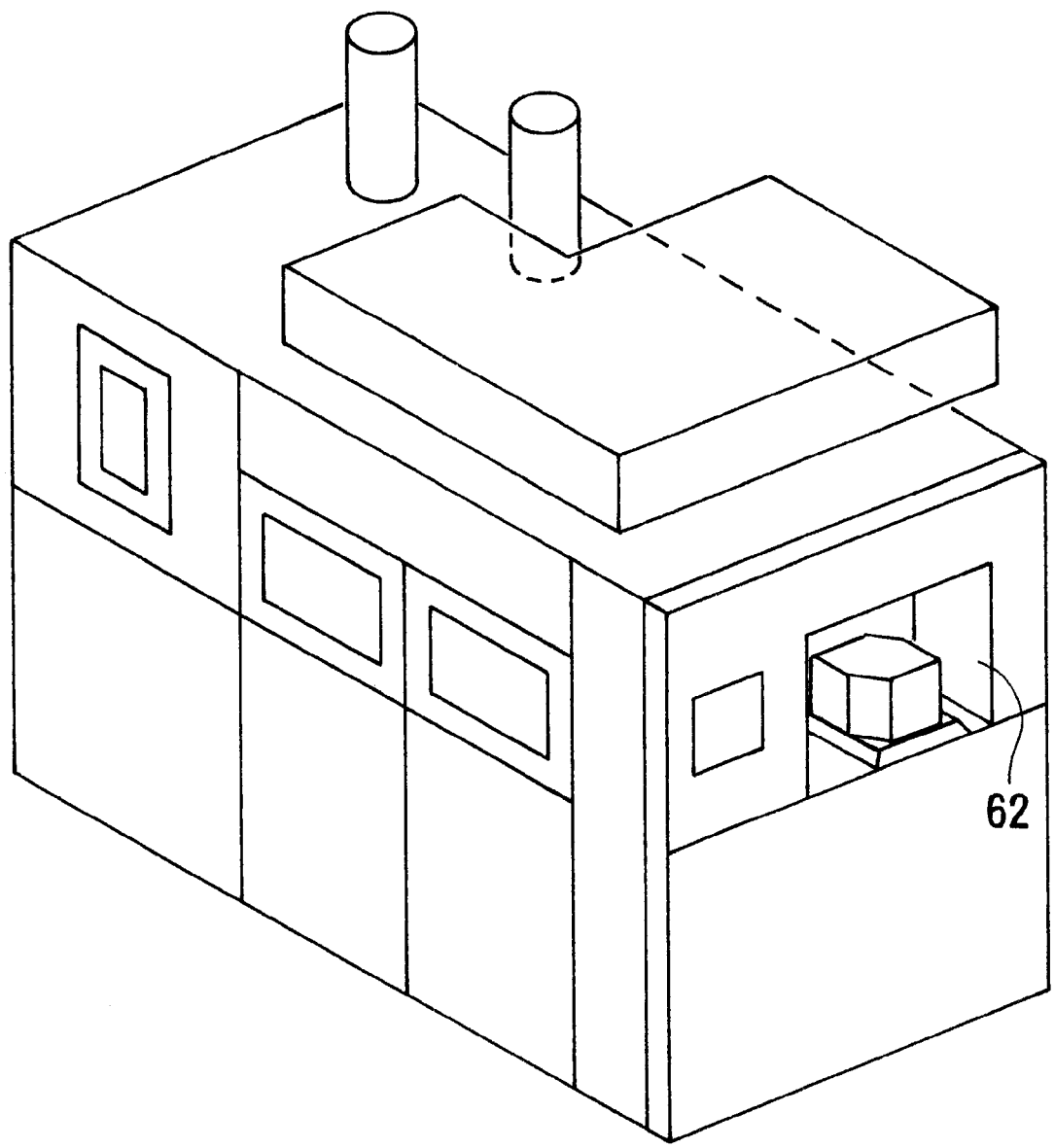

METHOD FOR MOUNTING SEMICONDUCTOR DEVICE

BACKGROUND OF THE INVENTION

1. Field of the Invention

This invention relates to a method for electrically connecting electrodes of a semiconductor device (chip, pellet or die) to terminal electrodes on a circuit board. More specifically, the invention relates to a method for mounting a semiconductor device by face down bonding using metallic paste for connection, or a method for mounting a semiconductor device which involves the use of solder bumps for electrical connection of electrodes; a mounted structure of a semiconductor device produced by any of these methods; and a mounting system for the methods and the mounted structure.

2. Description of the Related Art

Soldering has been generally used for electrical connection of connecting electrodes of an electronic device to circuit pattern terminals on a circuit board. In recent years, a small package, such as an IC flat package, has come into use, and the number of connecting terminals has increased. Thus, a so-called pitch between adjacent connecting terminals has gradually narrowed, and it has become gradually difficult for a conventional soldering technique to provide electrical connections stably in such a narrow pitch.

To mount a semiconductor device, such as a chip, pellet or die, which is an uncovered active or passive device, called a bare device, on a circuit board while establishing an electrical connection between them, face down bonding has recently been in wide use. The face down bonding method comprises forming solder bumps beforehand on electrode pads of the semiconductor device, placing the solder bumps so as to downwardly face terminal electrodes on the circuit board, and heating the solder bumps at a high temperature to fusion bond the electrode of semiconductor device to the terminal electrode of circuit board. The solder bumps are generally formed on three metallic thin films (under bump metals) comprising, for example, Cr (chromium), Cu (copper) and Au (gold), by soldering, plating or vapor deposition using a resist pattern.

This mounting method imparts high mechanical strength after connection, and is capable of electrically connecting the plural electrodes of the semiconductor device to the terminal electrodes of the circuit board at a time. Thus, it has been considered an effective method for mounting a semiconductor device.

In the conventional method of mounting a semiconductor device using solder bumps, however, the three metallic thin films (under bump metals) comprising, for example, Cr (chromium), Cu (copper) and Au (gold) need to be formed prior to the formation of the solder bumps. Formation of these thin films has required not only considerably extensive equipment, but also mask management and vacuum management, thus leading to increase in the cost and working time. According to the conventional method of mounting a semiconductor device using solder bumps, moreover, the solder spreads during heat fusion, and the adjacent solder bumps (electrodes) may form short-circuit. Thus, this method may fail to be applied to micro-fabricated products.

It has been proposed to form balls from a metallic fine particle paste containing metallic ultra-fine particles, and use these balls instead of the above-mentioned solder bumps (see Japanese Laid-open Patent Publication No. 326416/1997). However, the metallic ultra-fine particles used in this method are considered to be ultra-fine particles of a metal alone which were prepared, for example, by the following method: A metal is evaporated in a vacuum in the presence of a small amount of gas to coagulate ultra-fine particles consisting only of metal from a vapor phase, thereby obtaining ultra-fine metallic particles. Such metallic ultra-fine particles may be problematical in stability, physical properties, and cost.

SUMMARY OF THE INVENTION

The present invention has been accomplished in light of the foregoing circumstances. An object of the present invention is to provide a method for mounting a semiconductor device, the method enabling the solder bump method to be conveniently performed, and being capable of realizing a highly stable, low-cost, high reliability electrical connection, and also provide a mounted structure by this method. Another object of the invention is to provide a method for mounting a semiconductor device, the method being capable of realizing a highly stable, low-cost, high reliability electrical connection, which has no risk of short-circuiting adjacent electrodes of even a narrow pitch; and a mounted structure of the semiconductor device produced by this method.

According to the present invention, there is provided a method, a structure and a system for mounting a semiconductor device by the bump technique using compound metallic ultra-fine particles each comprising a core portion consisting substantially of a metallic component, and a coating layer chemically bound to the core portion and comprising an organic substance. The method, the structure and the system are characterized by using one of, or a combination of, the following two bump technologies:

1) Forming under bump metals from the compound metallic ultra-fine particles, and forming ordinary solder balls on the under bump metals.
2) Using paste balls comprising the compound metallic ultra-fine particles, instead of ordinary solder balls.

That is, an aspect of the present invention is a method for mounting a semiconductor device, comprising: preparing a metallic ultra-fine particle paste by dispersing compound metallic ultra-fine particles in a solvent, the compound metallic ultra-fine particles each comprising a core portion consisting substantially of a metallic component and a coating layer chemically bound to the core portion and comprising an organic substance; forming ultra-fine particle electrodes by attaching the metallic fine particle paste onto electrodes of the semiconductor device, followed by low temperature heat process; forming solder bumps on the ultra-fine particle electrodes; and connecting the solder bumps to terminal electrodes of a circuit board by heat fusing thereof.

According to the above methods, the metallic fine particle paste is adhered onto the electrodes of the semiconductor device, and subjected to low temperature heat process. Thus, the ultra-fine particle electrodes, which serve as under bump metals for solder bumps, can be formed easily and promptly without using extensive equipment.

Another aspect of the present invention is a method for mounting a semiconductor device, comprising: preparing a metallic fine particle paste by dispersing compound metallic ultra-fine particles in a solvent, the compound metallic ultra-fine particles each comprising a core portion consisting substantially of a metallic component, and a coating layer chemically bound to the core portion and comprising an organic substance; forming metallic fine particle paste balls consisting mainly of the compound metallic ultra-fine particles by attaching the metallic fine particle paste onto terminal electrodes of a circuit board; connecting electrodes of the semiconductor device onto the metallic fine particle paste balls by the face down bonding method; and electrically connecting electrodes of the semiconductor device and the circuit board by low temperature heat process.

The compound metallic ultra-fine particles can be prepared by a chemical process in a liquid phase. Thus, they can be mass produced in an ordinary atmospheric state, for a low cost, with the use of a simple apparatus without the need to use an extensive apparatus. Furthermore, the compound metallic ultra-fine particles have an organic substance as the coating layer. Thus, when in the solvent, these particles are minimally aggregatable, stable and easy to handle. Consequently, the metallic fine particle paste having the compound metallic ultra-fine particles uniformly dispersed therein can be prepared, and process control for the metallic fine particle paste is easy. Moreover, the particle diameters are uniform, so that all the compound metallic ultra-fine particles are fused and bound together at a constant temperature during low temperature heat treatment.

In the above methods for mounting a semiconductor device, the core portion is a positively charged, metallic ultra-fine particle of Ag, Au or Pb with an average particle diameter of 1 to 10 nm, and the coating layer is an organic anion having 5 or more carbon atoms.

In the methods for mounting a semiconductor device, the low temperature heat process is performed in a temperature range of 200 to 300° C. The temperature is not lower than the temperature at which the coating layer is released from the core portion and core portions are fused and bound together.

The above and other objects, features, and advantages of the present invention will be apparent from the following description when taken in conjunction with the accompanying drawings which illustrates preferred embodiments of the present invention by way of example.

BRIEF DESCRIPTION OF THE DRAWINGS

FIGS. 1A and 1B are views schematically showing the structure of a compound metallic ultra-fine particle;

FIGS. 2A to 6 are views showing a method for mounting a semiconductor device according to a first embodiment of the present invention in the order of steps;

FIGS. 2A and 2B are plan view and side view showing an example of the semiconductor device as an object to be mounted.

FIG. 4 is a view in which virtual lines show the formation of solder bumps on the ultra-fine particle electrodes by solder bump forming device;

FIG. 5 is a view showing a state immediately before bonding of the semiconductor device to a circuit board by bonding device;

FIG. 6 is a view showing a state immediately after bonding of the semiconductor device to the circuit board;

FIG. 7A shows forming metallic paste balls onto terminal electrodes of the circuit board by dripping device;

FIG. 7B shows that metallic paste balls are formed on the terminal electrodes of the circuit board;

FIG. 7C shows face down bonding of the semiconductor device by bonding device;

FIG. 7D shows that semiconductor device is bonded to the circuit board via metallic paste balls;

FIG. 7E shows that electrical connections are formed between electrodes of semiconductor device and circuit board by passing through heat treatment furnace;

FIG. 10 is an outside view of a mounting system of FIG. 9.

DETAILED DESCRIPTION OF THE PREFERRED EMBODIMENTS

Figure 2A:
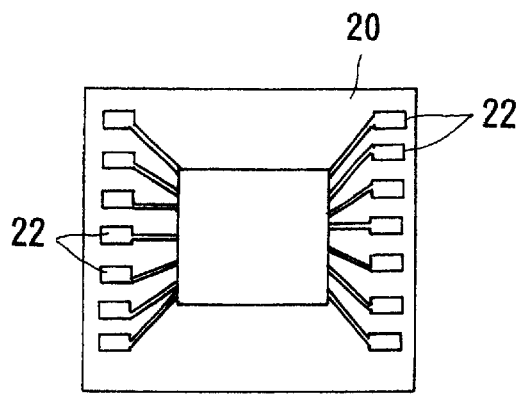

Preferred embodiments of the present invention will now be described in detail with reference to the accompanying drawings.

As shown in FIGS. 1A and 1B, a compound metallic ultrafine particle 14 comprising a core portion 10 and a coating layer 12 is prepared. The core portion 10 consists substantially of a metallic component, and the coating layer 12 comprises an organic substance. The compound metallic ultra-fine particle 14 has its core covered with the coating layer 12 comprising the organic substance. Thus, the compound metallic ultra-fine particle 14 is stable, and has a low tendency to aggregate in a solvent.

The compound metallic ultra-fine particle 14 is composed of the organic substance and the metallic component, which is derived from a metal salt as a starting material, e.g., a carbonate, a formate or an acetate. The center portion of the compound metallic ultra-fine particle 14 comprises the metallic component, which is surrounded with an ionic organic substance. The organic substance and the metallic component are combined integrally, with part or all of them being chemically bonded together. Unlike a conventional ultra-fine particle stabilized by coating with a surface active agent, the compound metallic ultra-fine particle 14 has high stability, and is also stable even at a higher metal concentration.

The average particle diameter of the core portion 10 of the compound metallic ultra-fine particle 14 is 1 to 10 nm. By so constituting the compound metallic ultra-fine particle 14, the core portion 10 can be fused and bonded together at a considerably lower temperature than the melting point of the metal itself, whereby low temperature firing (formation of fused and bonded metal body) can be achieved.

The compound metallic ultra-fine particle 14 can be produced, for example, by heating a metal salt, such as a carbonate, formate or acetate, in a nonaqueous solvent and in the presence of an ionic organic substance, at a temperature not lower than the decomposition reduction temperature of the metal salt, but lower than the decomposition temperature of the ionic organic substance. Regarding to the metallic component, Ag, Au or Pb is suitably used. As the ionic organic substance, a fatty acid, an alkylbenzenesulfonic acid, or an alkylsulfonic acid, each having 5 or more carbon atoms, is used.

The heating temperature is not lower than the decomposition reduction temperature of the metal salt such as a carbonate, formate or acetate, but lower than the decomposition temperature of the ionic organic substance. In the case of silver acetate, for example, the temperature at which its decomposition begins is 200° C. Thus, silver acetate may be held at a temperature of higher than 200° C., and at a temperature at which the ionic organic substance is not decomposed. In this case, in order to make the ionic organic substance difficult to decompose, heating atmosphere is preferably inert gas atmosphere. By selecting a nonaqueous solvent, however, heating can be performed even in the air.

During heating, various alcohols can be added, whereby the reaction can be promoted. The alcohols are not restricted, as long as the above effect is obtained. Their examples are lauryl alcohol, glycerin, and ethylene glycol. The amount of the alcohol added can be determined, as desired, depending on the type of the alcohol used. Normally, the alcohol may be added in an amount of about 5 to 20 parts by weight, preferably 5 to 10 parts by weight, with respect to 100 parts by weight of the metal salt. After heating is completed, purification is performed by a publicly known purification method. The purification method may, for example, be centrifugation, membrane purification, or solvent extraction.

As an example of production, oleic acid is used as an organic anionic substance, and silver acetate is used as a metal source. These materials are placed in a naphthenic high boiling solvent having a distillation point of 250° C. The mixture is heated for 3 hours at 240° C., and acetone is further added for precipitation and purification. In this manner, compound metallic ultra-fine particles can be prepared. The compound metallic ultra-fine particles comprise clustered, positively charged Ag metallic ultrafine particles (core metal) with an average particle diameter of about 10 nm, and organic anions (coating layer) coating the circumference of the metallic particles. The resulting compound metallic ultra-fine particles 14 are dispersed in a predetermined solvent such as toluene, and if desired, a resin or an additive is added to prepare a metallic paste.

A first embodiment of the present invention will be described with reference to FIGS. 2A to FIG. 6.

Figure 2B:
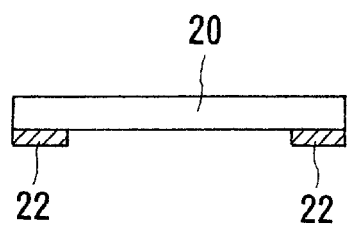
Figure 2C:
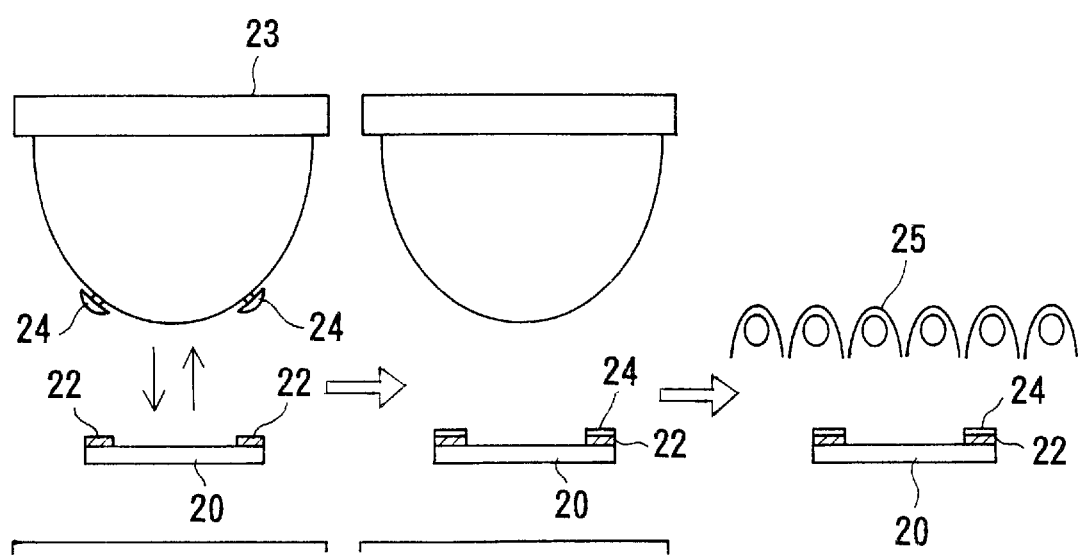
FIG. 2C shows steps (a)(b)(c) of forming under bump metal layer.

A semiconductor device 20 having a plurality of aluminum electrodes 22 in a peripheral edge portion, as shown in FIGS. 2A and 2B, is prepared for use as a semiconductor device to be mounted. A metallic paste 24, which has been prepared by dispersing the compound metallic ultra-fine particles 14 in a predetermined solvent such as toluene, is applied onto each of the electrodes 22, for example, by printing device 23, as shown in FIG. 2C(a)(b). Such a metallic paste 44 is almost transparent and the physical properties of the metallic paste 24 such as surface tension and viscosity, can be adjusted by selecting the type of the solvent, the concentration of the compound metallic ultra-fine particles, and the temperature, as desired.

Then, the metallic paste 24 is subjected to low temperature heat process as shown in FIG. 2C(c), for example, at 200 to 300° C. to form ultra-fine particle electrodes 26 comprising the core portions (metal) 10 of the compound metallic ultra-fine particles 14. In detail, during the low temperature heat process by the lamp furnace 25, the solvent, such as toluene, contained in the metallic paste 24 is evaporated. Furthermore, the compound metallic ultra-fine particles 24 as the main component of the metallic paste 24 are heated at a temperature not lower than the temperature at which the coating layer (organic substance) 12 (see FIGS. 1A and 1B) is released from the core portion 10 or the coating layer 12 itself is decomposed. As a result, the coating layer 12 is released from the core portion 10, or the coating layer 12 is decomposed to vanish. Simultaneously, the core portions 10 are fused and bound together to form ultra-fine particle electrodes 26.

Figure 3A:
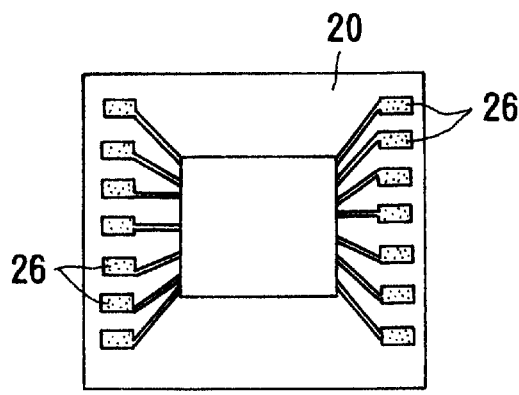
FIGS. 3A and 3B are plan view and side view showing under bump layers adhered to electrodes of the semiconductor device illustrated in FIGS. 2A and 2B.
Figure 3B:
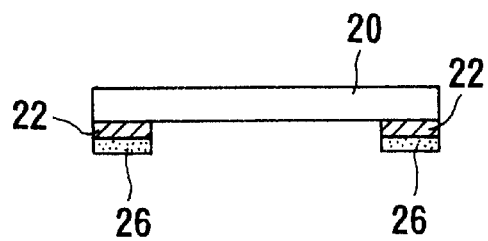

As shown in FIGS. 3A and 3B, the ultra-fine particle electrodes 26 serve as under bump metals for solder bumps 32. By so applying the metallic paste 24 onto the electrodes 22, followed by low temperature heat process, the ultra-fine particle electrode 26 can be formed easily and promptly without using extensive equipments such as expensive photolithography equipments or chemical vapor deposition equipments.

Figure 4:
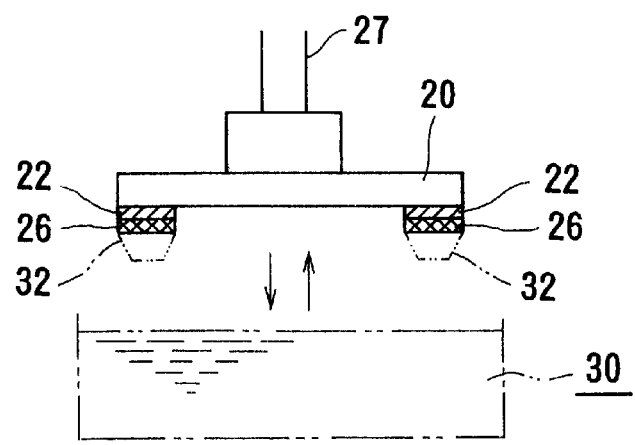

Then, the solder bumps 32 are formed on the ultra-fine particle electrodes 26, for example, by dipping the ultra-fine particle electrodes 26 in a molten solder bath 30 and lifting them, as shown by virtual lines in FIG. 4. The dipping is carried out by using solder bump forming device 27 including the molten solder bath 30. The solder bumps 32 may be formed on the ultra-fine particle electrodes 26 by printing a solder paste.

Figure 5:
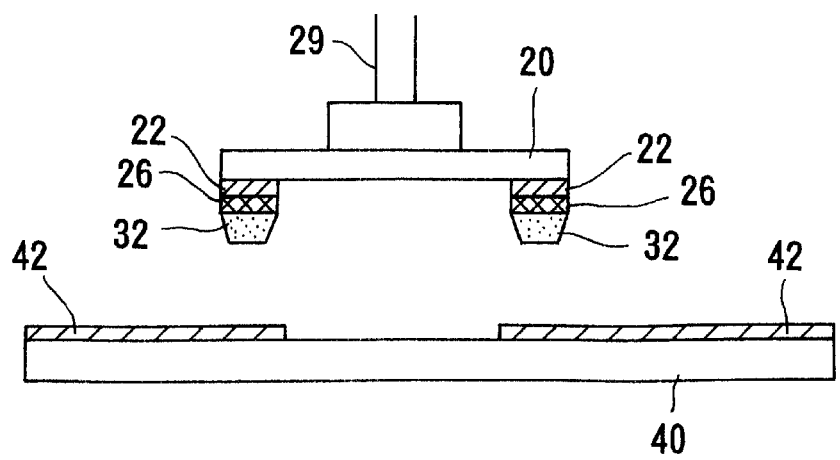

Next, as shown in FIG. 5, the solder bumps 32 provided on the semiconductor device 20 are connected to predetermined positions on terminal electrodes 42 of a circuit board 40 by the flip chip bonding method in which the solder bumps 32 of the semiconductor device 20 and the terminal electrodes 42 of the circuit board 40 are aligned, with the semiconductor device 20 upside down in a face down manner. Such face down bonding is carried out by using bonding device 29.

In this state, the resulting assembly is passed through, for example, a heat treatment furnace for reflow of the solder constituting the solder bumps 32 to perform heat fusing with the terminal electrodes 42 of the circuit board 40. In this manner, the plurality of solder bumps 32 and the terminal electrodes 42 of the circuit board 40 can be electrically connected at a time.

According to this embodiment, as described above, the solder bump method can be performed conveniently, and a highly stable, low-cost, high reliability electrical connection can be realized to mount a semiconductor device on a circuit board.

These mounting steps are performed by a mounting system which uses printing device 23 for printing metallic paste as shown in FIG. 2C, lamp furnace 25 for forming under bump layer as shown in FIG. 2C, bonding device 29 for bonding semiconductor device 20 onto circuit board 40 as shown in FIG. 5, and furnace for heat treatment to form solder connections between solder bumps 32 and terminal electrodes 42 on the circuit board 40.

Figure 8:
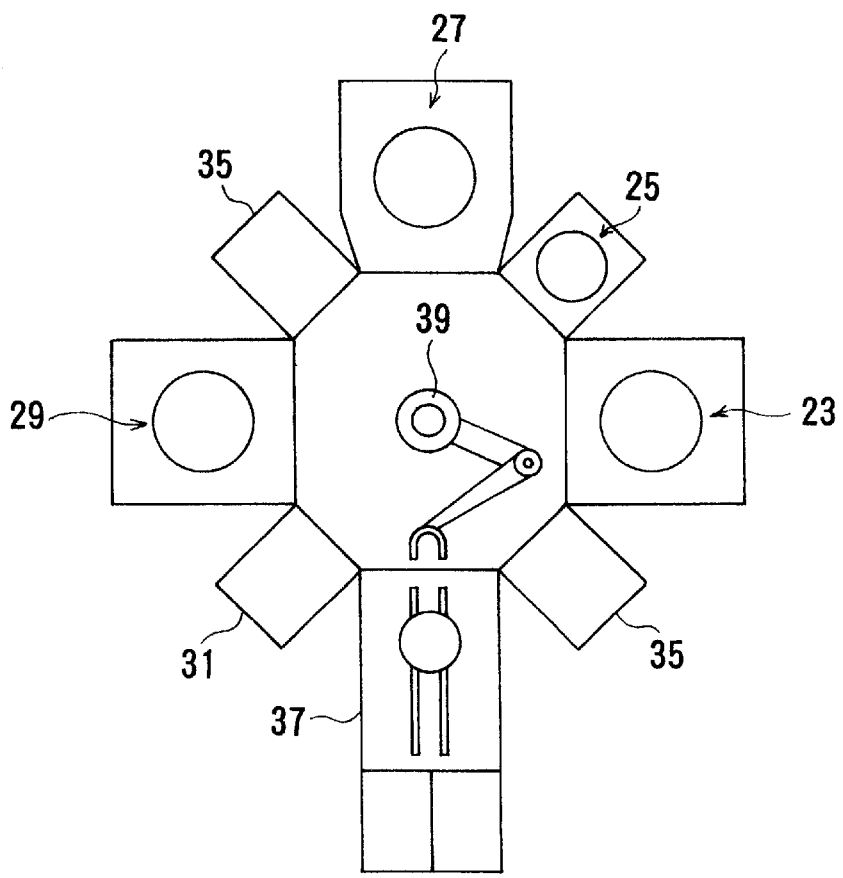
FIG. 8 is a schematic view showing a mounting system configuration example according to the first embodiment.

These devices for constituting the mounting system are disposed as shown in FIG. 8, for example. The under metal layer 26 comprised by metallic ultra-fine particles fused and bound together is formed by printing device 23 and lamp furnace 25. The solder bump 32 is formed by solder bump forming device 27. Electrical connection between the bump and the terminal electrode is securely formed by the heat treatment furnace 31. The interposed devices 35 are utilities for stocking the products or cooling the products, etc. The mounting system is also equipped with load/unload device 37 and handling robot 39.

Each device of the mounting system is controlled independently by a computer. However, informations of process steps are exchanged each other, and process informations are feed-back controlled. Thus optimum process control of the mounting system can be performed.

Next, a second embodiment of the present invention will be described with reference to FIGS. 7A, 7B, 7C, 7D and 7E.

The step of preparing a compound metallic ultra-fine particle 14 comprising a core portion 10 consisting substantially of a metallic component, and a coating layer 12 comprising an organic substance, as shown in FIGS. 1A and 1B, is the same as early described. The resulting compound metallic ultra-fine particles 14 are dispersed in a predetermined solvent such as toluene, and if desired, a metal having high electrical conductivity and measuring about 0.1 to 1 μm, such as Ag, Au, Pd or Al, and a resin or an additive is added to prepare a metallic paste.

Figure 7A:
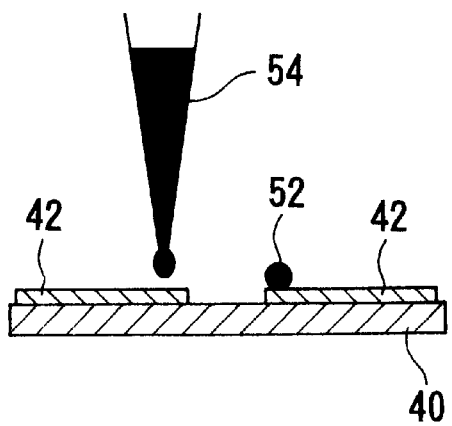
FIGS. 7A to 7E are views showing a method for mounting a semiconductor device according to a second embodiment of the present invention in the order of steps.
Figure 7B:
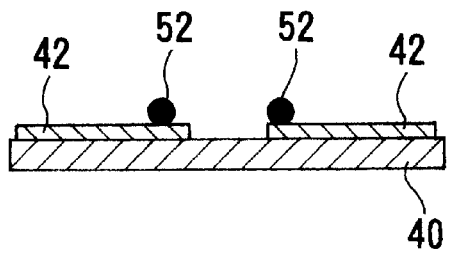

As shown in FIG. 7A, the metallic paste is dripped onto predetermined positions of terminal electrodes 42 of a circuit board 40 by using dripping device 54. The dripped paste forms about 2 μm high metallic paste balls 52 consisting mainly of the compound metallic ultra-fine particles 14 as shown in FIG. 7B. Such a metallic paste is almost transparent because when in a solvent in which the compound metallic ultra-fine particles 14 have been mixed and stirred, the compound metallic ultra-fine particles 14 are very fine. However, the physical properties of the metallic paste, such as surface tension and viscosity, can be adjusted by selecting the type of the solvent, the concentration of the compound metallic ultra-fine particles, and the temperature, as desired.

Figure 7C:
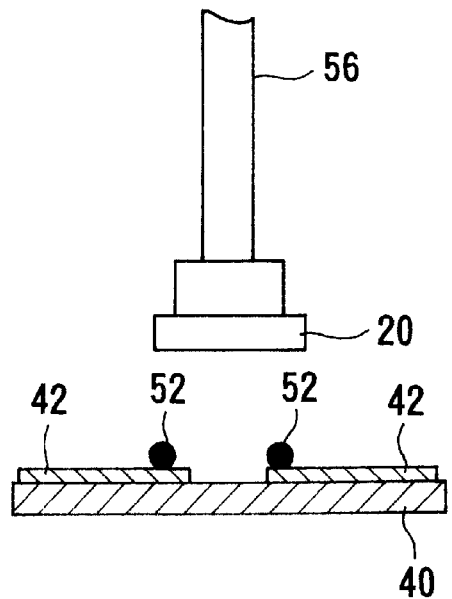
Figure 7D:
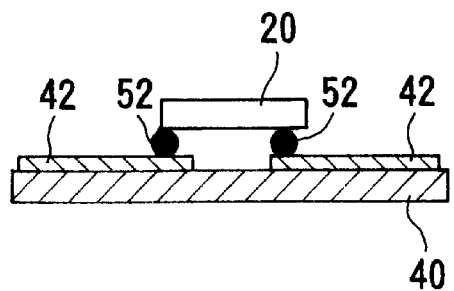

Then, as shown in FIG. 7C, electrode pads provided on a semiconductor device 20 are connected onto the metallic paste balls 52, by the flip chip bonding device 56 in which the electrode pads of the semiconductor device 20 and the metallic paste balls 52 are aligned, with the semiconductor device 20 upside down in a face down manner. If desired, leveling is carried out with the use of the weight onto the semiconductor device 30. Then the semiconductor device 20 is bonded onto circuit board 40 via metallic paste balls 52 as shown in FIG. 7D.

Figure 7E:
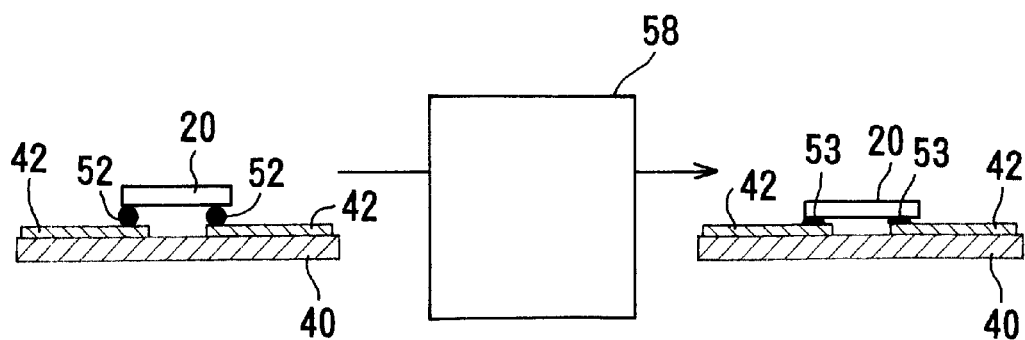

In this state, low temperature firing (heat treatment) is performed as shown in FIG. 7E, for example, for 30 minutes at 200 to 250° C. by means of a furnace 58 to form a conductor connector portion 53 which electrically connects the semiconductor device 20 and the circuit board 40. In detail, during the low temperature heat process, the solvent, such as toluene, contained in the metallic paste balls 52 is evaporated. Furthermore, the compound metallic ultra-fine particles 14 as the main component of the metallic paste balls 52 are heated at a temperature not lower than the temperature at which the coating layer (organic substance) 12 (see FIGS. 1A and 1B) is released from the core portion 10 or the coating layer 12 itself is decomposed. As a result, the coating layer 12 is released from the core portion 10, or the coating layer 12 is decomposed to vanish. Simultaneously, the core portions 10 are fused and bound together to form metal conductor.

In this manner, low temperature heat process is performed, for example, in a temperature range of 200 to 250° C. to connect the semiconductor device and the circuit board electrically. Thus, heat distortion minimally occurs. In addition, the absence of soldering can avoid a short circuit due to a flow of a solder, and connection with a finer pitch can be achieved. If a metallic paste incorporating high conductivity metal particles, as stated earlier, is used, high conductivity can be ensured via this metal conductor connection, and the reliability of mounting semiconductor device technology can be enhanced.

As described above, a highly stable, low-cost, high reliability electrical connection with no risk of short-circuiting adjacent electrodes of even a narrow pitch can be realized to mount a semiconductor device on a circuit board.

The mounting system for mounting semiconductor devices according to the embodiment comprises the dripping device 54 for forming the paste balls 52 as shown in FIG. 7A, the dryer for drying the dripped paste ball 52, the bonding device 56 for bonding semiconductor device 20 as shown in FIG. 7C and the heat treatment furnace 58 for fusing ultra-fine metal particles to be bound together to form metal conductor as shown in FIG. 7E.

Figure 9:
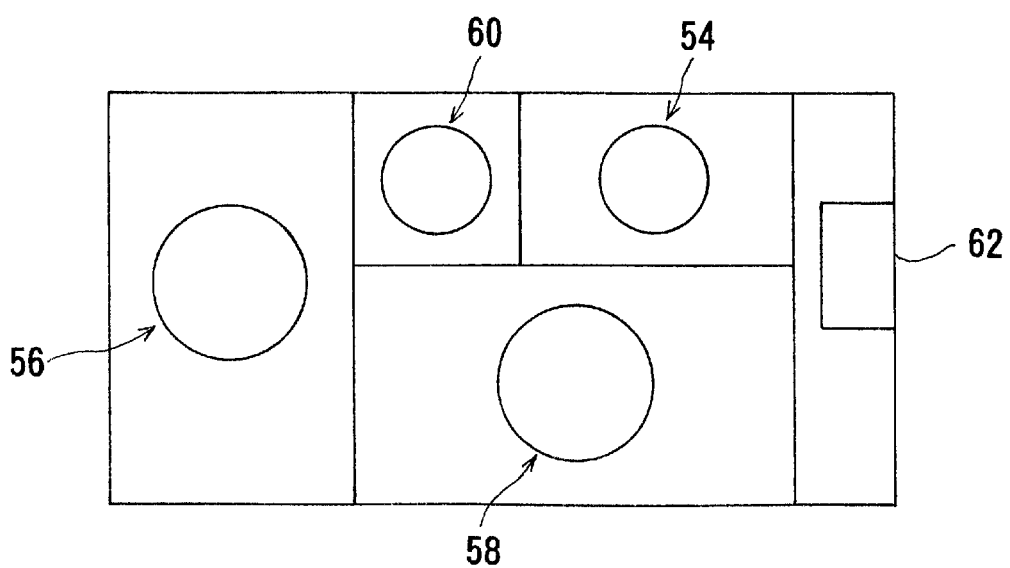
FIG. 9 is a plan view of a mounting system constituting an integral type according to the second embodiment.

These mounting devices are disposed integrally as shown in FIGS. 9 and 10, for example. Namely, dripping device 54, dryer 60 for paste balls, bonding device 56, heat treatment furnace 58 and load/unload device 62 are disposed integrally.

Each device of the system is controlled independently by a computer. However, informations of every process step are exchanged each other, and process informations are feedback controlled. Thus optimum process control of the system can be performed.

Although certain preferred embodiments of the present invention have been shown and described in detail, it should be understood that various changes and modifications may be made therein without departing from the scope of the appended claims.

What is claimed is:

1. A method for mounting a semiconductor device, comprising:
   preparing a metallic fine particle paste by dispersing compound metallic ultra-fine particles in a solvent, the compound metallic ultra-fine particles each comprising a core portion consisting substantially of a metallic component, and a coating layer chemically bound to the core portion and comprising an organic substance;
   forming ultra-fine particle electrodes by coating the metallic fine particle paste onto electrodes of the semiconductor device, followed by low temperature heat processing at a temperature not lower than a temperature for releasing the coating layer from the core portion and fusing the core portions to bind the core portions together.

2. The method for mounting a semiconductor device as claimed in claim 1, wherein the metallic fine particle paste has a metal and a resin added thereto, the metal having high conductivity and measuring about 0.1 to 1 μm.

3. The method for mounting a semiconductor device as claimed in claim 1, wherein the core portion is positively charged, and comprises metallic ultra-fine particle of Ag, Au or Pb with an average particle diameter of 1 to 10 nm, and
   the coating layer is an organic anion having 5 or more carbon atoms.

4. The method for mounting a semiconductor device as claimed in claim 1, wherein the low temperature heat process is performed in a temperature range of 200 to 300° C.

5. The method according to claim 1 further comprising:
   a. forming solder bumps on the ultra-fine particle electrodes; and
   b. connecting the solder bumps to terminal electrodes of a circuit board by heat fusing of the solder bumps.

6. A method for mounting a semiconductor device, comprising:
   preparing a metallic fine particle paste by dispersing compound metallic ultra-fine particles in a solvent, the compound metallic ultra-fine particles each comprising a core portion consisting substantially of a metallic component, and a coating layer chemically bound to the core portion and comprising an organic substance;
   forming metallic fine particle paste balls consisting mainly of the compound metallic ultra-fine particles by attaching the metallic fine particle paste onto terminal electrodes of a circuit board;

connecting electrodes of the semiconductor device onto the metallic fine particle paste balls by a face down bonding method; and forming ultra-fine particle electrodes from the paste balls by low temperature heat process at a temperature not lower than a temperature for releasing the coating layer from the core portion and fusing the core portions to bind the core portions together, thereby electrically connecting the semiconductor device and the circuit board.

7. The method for mounting a semiconductor device as claimed in claim 6, wherein the metallic fine particle paste has a metal and a resin added thereto, the metal having high conductivity and measuring about 0.1 to 1 $\mu$m.

8. The method for mounting a semiconductor device as claimed in claim 6, wherein the core portion is positively charged, and comprises metallic ultra-fine particle of Ag, Au or Pb with an average particle diameter of 1 to 10 nm, and the coating layer is an organic anion having 5 or more carbon atoms.

9. The method for mounting a semiconductor device as claimed in claim 6, wherein the low temperature heat process is performed in a temperature range of 200 to 300° C.

* * * * *